US008381097B2

(12) United States Patent
Ruellan et al.

(10) Patent No.: US 8,381,097 B2
(45) Date of Patent: Feb. 19, 2013

(54) DETERMINING OPTIMAL PARAMETER FOR BINARY CODING OF A STRUCTURED DOCUMENT

(75) Inventors: Hervé Ruellan, Rennes (FR); Romain Bellessort, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 12/815,579

(22) Filed: Jun. 15, 2010

(65) Prior Publication Data

US 2010/0318896 A1     Dec. 16, 2010

(30) Foreign Application Priority Data

Jun. 16, 2009  (EP) ..................................... 09290452

(51) Int. Cl.
*G06F 17/00* (2006.01)
(52) U.S. Cl. ........ 715/242; 715/234; 382/232; 382/239; 341/50
(58) Field of Classification Search .................. 715/242; 382/232; 341/50
See application file for complete search history.

(56) References Cited

U.S. PATENT DOCUMENTS

| | | | | |
|---|---|---|---|---|
| 6,624,769 | B2 | 9/2003 | Oktem et al. | 341/87 |
| 7,280,052 | B2* | 10/2007 | Levy | 341/51 |
| 2007/0127826 | A1* | 6/2007 | Kishi | 382/232 |
| 2007/0208792 | A1 | 9/2007 | Berjon et al. | 708/207 |
| 2008/0062018 | A1* | 3/2008 | Normile et al. | 341/50 |
| 2008/0063114 | A1 | 3/2008 | Joung et al. | 375/298 |
| 2008/0098029 | A1 | 4/2008 | Ruellan | 707/102 |
| 2008/0250055 | A1 | 10/2008 | Ruellan et al. | 707/102 |
| 2009/0138529 | A1 | 5/2009 | Bellessort | 707/203 |
| 2009/0254882 | A1 | 10/2009 | Ruellan | 717/120 |
| 2009/0287625 | A1 | 11/2009 | Fablet et al. | 706/45 |
| 2010/0001886 | A1 | 1/2010 | Bellessort et al. | 341/51 |
| 2010/0083101 | A1 | 4/2010 | Denoual et al. | 715/242 |
| 2010/0115397 | A1 | 5/2010 | Bellessort et al. | 715/234 |
| 2010/0153837 | A1 | 6/2010 | Bellessort et al. | 715/234 |
| 2010/0192056 | A1 | 7/2010 | Bellessort et al. | 715/237 |

FOREIGN PATENT DOCUMENTS

| | | |
|---|---|---|
| EP | 2 040 178 A2 | 3/2009 |
| WO | 2006/041259 A1 | 4/2006 |

OTHER PUBLICATIONS

Adiego, J., et al., "Lempel-Ziv Compression of Highly Structured Documents", Journal of the American Society for Information Science and Technology, vol. 58, No. 4, Jan. 25, 2007, pp. 461-478.
Liefke, H., "User Manual for XMill", http://www.liefke.com/hartmut/xmill/manual.txt (last visited Feb. 12, 2009), 15 pages.

* cited by examiner

*Primary Examiner* — Doug Hutton, Jr.
*Assistant Examiner* — Scott M Kelly
(74) *Attorney, Agent, or Firm* — Fitzpatrick, Cella, Harper & Scinto

(57) ABSTRACT

Method and device for binary coding a structured document comprising a plurality of data are disclosed. After having determined (130) at least one parameter of a first coding scheme (130) and of at least one second coding scheme (140) according to said at least one parameter of said first coding scheme, said first and said at least one second coding scheme being of the same type, at least one item of data of said plurality of data is obtained. The coding efficiencies of said at least one item of data according to said first and said at least one second coding schemes are evaluated and compared (160). Depending on said comparison, said at least one item of data is coded (170) according to said first or said at least one second coding scheme.

14 Claims, 5 Drawing Sheets

DETERMINING OPTIMAL PARAMETER FOR BINARY CODING OF A STRUCTURED DOCUMENT

FIELD OF THE INVENTION

The present invention relates generally to coding and decoding of sequences of symbols and more specifically to methods and devices for binary coding and decoding of structured documents comprising a plurality of data such as an SVG-like path.

BACKGROUND OF THE INVENTION

Extensible Markup Language (XML) is a syntax for defining computer languages. XML makes it possible to create languages that are adapted for different uses but which may be processed by the same tools.

An XML document is composed of elements, each element starting with an start-tag comprising the name of the element, for example, <tag>, and ending with a end-tag which also comprises the name of the element, for example, </tag>. Each element can contain other elements or character data.

An element may be specified by attributes, each attribute being defined by a name and having a value. The attributes are placed in the opening tag of the element they specify, for example <tag attribute="value">.

XML syntax also makes it possible to define comments, for example <!--Comment-->, and processing instructions which may specify to a computer application what processing operations to apply to the XML document, for example <?myprocessing?>.

The elements, attributes, text data, comments and processing instructions are grouped together under the generic name of item.

Several different XML languages may contain elements with the same name. To use several different languages, an addition has been made to XML syntax making it possible to define namespaces. Two elements are identical only if they have the same name and are situated in the same namespace. A namespace is defined by a Uniform Resource Identifier (URI), for example http://canon.crf.fr/xml/mylanguage. The use of a namespace in an XML document is via the definition of a prefix which is a shortcut to the URI of that namespace. The prefix is defined using a specific attribute. By way of illustration, the expression xmlns:ml="http://canon.crf.fr/xml/mylanguage" associates the prefix ml with the URI http://canon.crf.fr/xml/mylanguage. The namespace of an element or of an attribute is specified by having its name preceded by the prefix associated with the namespace followed by ':', for example, <ml:tag ml:attribute="value">.

XML has numerous advantages and has become a standard for storing data in a file or for exchanging data. XML makes it possible in particular to have numerous tools for processing the files generated. Furthermore, an XML document may be manually edited with a simple text editor. Moreover, an XML document, containing its structure integrated with the data, is easily readable even without knowing the specification.

However, the main drawback of the XML syntax is to be verbose. Thus, the size of an XML document may be several times greater than the inherent size of the data. This large size of XML documents thus leads to a long processing time when XML documents are generated and especially when they are read.

To mitigate these drawbacks, mechanisms for coding XML documents have been sought. The object of these mechanisms is to code the content of the XML document in a more efficient form but enabling the XML document to be easily reconstructed. However, most of these mechanisms do not maintain all the advantages of the XML format. Numerous new formats, enabling the data contained in an XML document to be stored, have thus been proposed. These different formats are grouped together under the appellation "Binary XML".

Among these mechanisms, the simplest consists of coding the structural data in a binary format instead of using a text format. Furthermore, the redundancy in the structural information in the XML format may be eliminated or at least reduced. Thus, for example, it is not necessarily useful to specify the name of the element in the start-tag and the end-tag. This type of mechanism is used by all the Binary XML formats.

Another mechanism consists of creating one or more index tables which are used, in particular, to replace the names of elements and attributes that are generally repeated in an XML document. Thus, at the first occurrence of an element name, it is coded normally in the file and an index is associated with it. Then, for the following occurrences of that element name, the index will be used instead of the complete string, reducing the size of the document generated, but also facilitating the reading. More particularly, there is no need to read the entire string in the file and, furthermore, determining the element read may be performed by a simple comparison of integers and not by a comparison of strings. This type of mechanism is implemented in several formats, in particular in the formats in accordance with the Fast Infoset and Efficient XML Interchange (EXI) specifications.

This mechanism may be extended to the text values and to the values of the attributes. In the same way, at the first occurrence of a text value or an attribute value, this is normally coded in the file and an index is associated with it. The following occurrences of that value are coded using the index. This type of mechanism is implemented in several formats, in particular the formats in accordance with the Fast Infoset and EXI specifications.

Still another mechanism consists of using index tables for describing the structure of certain categories of items of the document. Thus, for example, it is possible to use an index table for each element item having a given name. At the first occurrence of a child item in the content of that item, a new entry describing that child item type is added to the index table. At following occurrences of a similar item, that new child item is described using the associated index. This type of mechanism is implemented in the formats in accordance with the EXI specification.

Scalable Vector Graphics (SVG) data format is an XML language for describing vector graphics. SVG uses the XML format and defines a set of elements and attributes making it possible in particular to describe geometric shapes, transformations, colors and animations.

A much used tool in SVG is the path which represents the outline of a shape. A graphics path is a set of commands and associated coordinates, making it possible to describe a complex graphic shape using segments, Bezier curves and elliptical arcs.

Binary XML formats may be used to code SVG documents. However, most of these formats have limitations with regard to the coding of SVG documents. This is because, in numerous SVG documents, the proportion of structure is small relative to the proportion of content. However, Binary XML formats are mainly directed to compressing the structure of XML documents. In relation to content, Binary XML formats can index the values, in order not to code several times the same value that is repeated in the content. They may also code, in a specific way, certain contents of which the type is known and simple, for example an integer or a real number. But SVG contents satisfy none of these criteria: SVG contents which are large in size are rarely repeated and generally do not correspond to simple types. These contents of large size are for example paths, which mix simple graphics commands with coordinates, or lists of integer or real values.

For this reason, it is necessary to create new Binary XML formats that are specific to SVG documents or to adapt existing Binary XML formats to efficiently code SVG documents.

The patent U.S. Pat. No. 6,624,769 describes a Binary XML format adapted to code SVG documents. This patent describes in particular a specific way to code SVG paths consisting of first coding the commands used in the path and only attributing a code to the commands present in the path. Furthermore, these codes are Huffman type codes, of which the attribution is predefined for all the existing commands.

The command arguments are coded in binary manner, using the minimum number of bits enabling any argument present in the path to be coded. More precisely, the patent is limited to the coding of integer arguments, corresponding to the SVG profiles for mobile phones, and separates the arguments into two categories: the arguments corresponding to absolute commands and those corresponding to relative commands. In the case of an absolute command, the argument directly represents a position in the SVG coordinate system whereas in the case of a relative command, the argument represents the movement from the previous position. For each type of argument, calculation is made of the minimum number of bits enabling any argument of that type present in the path to be coded. Next, each argument is coded over a number of bits depending on its type.

The format described in this patent enables compact SVG documents to be obtained, but only applies to a restricted category of documents and is still of limited efficiency in the case of large paths.

U.S. Patent application No. 20080063114 describes the Lightweight Application Scene Representation (LASeR) binary XML format. This format is targeted at coding SVG documents and provides a specific way of coding an SVG path. According to this document, an SVG path is coded using one of two methods that provides the best results.

The first method consists in coding the first two arguments of the SVG path using a first fixed length coding scheme and coding all the remaining arguments as relative arguments using two other fixed length coding schemes. The first coding length of the first fixed length coding scheme is the minimum coding length that allows the first two arguments to be coded. The other two coding lengths are computed in a similar way: the first of these other coding lengths is the minimum coding length allowing all the abscissa coordinates to be coded while the second of these other coding lengths is the minimum coding length allowing all ordinate coordinates to be coded.

The second method consists in coding the first two arguments using a first fixed length coding scheme and coding all the further arguments as relative arguments using an exponential-Golomb coding scheme.

SUMMARY OF THE INVENTION

The invention notably makes it possible to increase the efficiency of compressing series of data, in particular series of numbers, for example data of SVG type.

The invention thus relates to a method of binary coding of a structured document comprising at least one plurality of data to code, the method comprising the following steps, determining at least one parameter of a first coding scheme;

determining at least one parameter of at least one second coding scheme according to said at least one parameter of said first coding scheme, said first and said at least one second coding scheme being of the same type;

obtaining at least one item of data of said at least one plurality of data;

evaluating the coding efficiency of said at least one item of data according to said first and said at least one second coding schemes;

comparing said coding efficiency of said first and said at least one second coding schemes for coding said at least one item of data; and, depending on said comparison, coding said at least one item of data according to said first or said at least one second coding scheme.

The coding method according to the invention improves coding efficiency of structured documents, in particular of documents of the SVG type, in a very efficient manner in terms of computation since the at least one parameter of the second coding scheme can be determined based on the parameter or parameters of the first coding scheme.

According to a particular embodiment, said at least one parameter of said first and said at least one second coding schemes comprises a coding length.

Said first and said at least one second coding schemes are preferably fixed-point coding schemes. A fixed-point coding scheme is particularly adapted to encode data composing SVG paths, in particular SVG path arguments.

Still according to a particular embodiment, said at least one parameter of said first and said at least one second coding schemes comprises a scaling factor. A scaling factor is a parameter of a fixed-point coding scheme, and further coding efficiency may be obtained in some cases by adapting the scaling factor of a second fixed-point coding scheme. According to a preferred embodiment, said at least one parameter of said at least one second coding scheme is equal to said at least one parameter of said first coding scheme decreased by a predefined value. In particular, said predefined value belongs to a set of predetermined values, for example a set of predetermined values comprised between 2 and 7. The computation of the parameter of the second coding scheme is extremely fast in this case, since a very small number of possible values need to be tested.

Still according to a preferred embodiment, said step of determining at least one parameter of said at least one second coding scheme further comprises the step of analyzing a subset of data of said at least one plurality of data to code.

Still according to a particular embodiment, the method further comprises a step of coding said at least one parameter of said first and at least one second coding schemes for optimizing data transfer and decoding.

Still according to a preferred embodiment, the method further comprises the step of pre-processing at least one item of data of said at least one plurality of data to code for improving coding efficiency.

Still according to a preferred embodiment, the method further comprises the step of evaluating the coding efficiency of said at least one item of data according to a third coding scheme, said third coding scheme being different from said first and said at least one second coding schemes, said step of comparing said coding efficiency of said first and said at least one second coding schemes for coding said at least one item of data comprising the step of comparing said coding efficiency of said third coding scheme for coding said at least one item of data with said coding efficiency of said first and said at least one second coding schemes for coding said at least one item of data, said at least one item of data being coded according to said first or said at least one second coding scheme or to said third coding scheme in response to said comparison to still improve coding efficiency. According to a particular embodiment, said third coding scheme is adapted to code repetitions of data patterns.

It is another object of the invention to provide a method of decoding a structured document comprising at least one plurality of data coded according to the method described above, the method of decoding comprising the following steps, decoding coding parameters comprising said at least one parameter of said first coding scheme and said at least one parameter of said at least one second coding scheme; and, decoding said at least one plurality of data according to said at least one parameter of said first coding scheme and said at least one parameter of said at least one second coding scheme.

It is still another object of the invention to provide a computer program comprising instructions for carrying out each step of the methods described above when the program is loaded and executed by a programmable apparatus.

It is still another object of the invention to provide an information storage means readable by a computer or a microprocessor storing instructions of a computer program, characterized in that it makes it possible to implement a method of binary coding of a structured document comprising at least one plurality of data to code as described above.

It is still another object of the invention to provide a device for binary coding a structured document comprising at least one plurality of data to code, the device comprising the following means, means for determining at least one parameter of a first coding scheme;

means for determining at least one parameter of at least one second coding scheme according to said at least one parameter of said first coding scheme, said first and said at least one second coding scheme being of the same type;

means for obtaining at least one item of data of said at least one plurality of data;

means for evaluating the coding efficiency of said at least one item of data according to said first and said at least one second coding schemes;

means for comparing said coding efficiency of said first and said at least one second coding schemes for coding said at least one item of data; and, means for coding said at least one item of data according to said first or said at least one second coding scheme depending on said comparison.

The coding device according to the invention improves coding efficiency of structured documents, in particular of documents of the SVG type.

It is still an object of the invention to provide a device for decoding a structured document comprising at least one plurality of data coded according the method described above, the device for decoding comprising the following means, means for decoding coding parameters comprising said at least one parameter of said first coding scheme and said at least one parameter of said at least one second coding scheme; and, means for decoding said at least one plurality of data according to said at least one parameter of said first coding scheme and said at least one parameter of said at least one second coding scheme.

The particular characteristics and advantages of the storage means, computer program and decoding device being similar to those of the method of binary coding of a structured document, they are not repeated here.

Further advantages of the present invention will become apparent to the ones skilled in the art upon examination of the drawings and detailed description. It is intended that any additional advantages be incorporated herein.

DETAILED DESCRIPTION OF THE PREFERRED EMBODIMENTS

Figure 1:
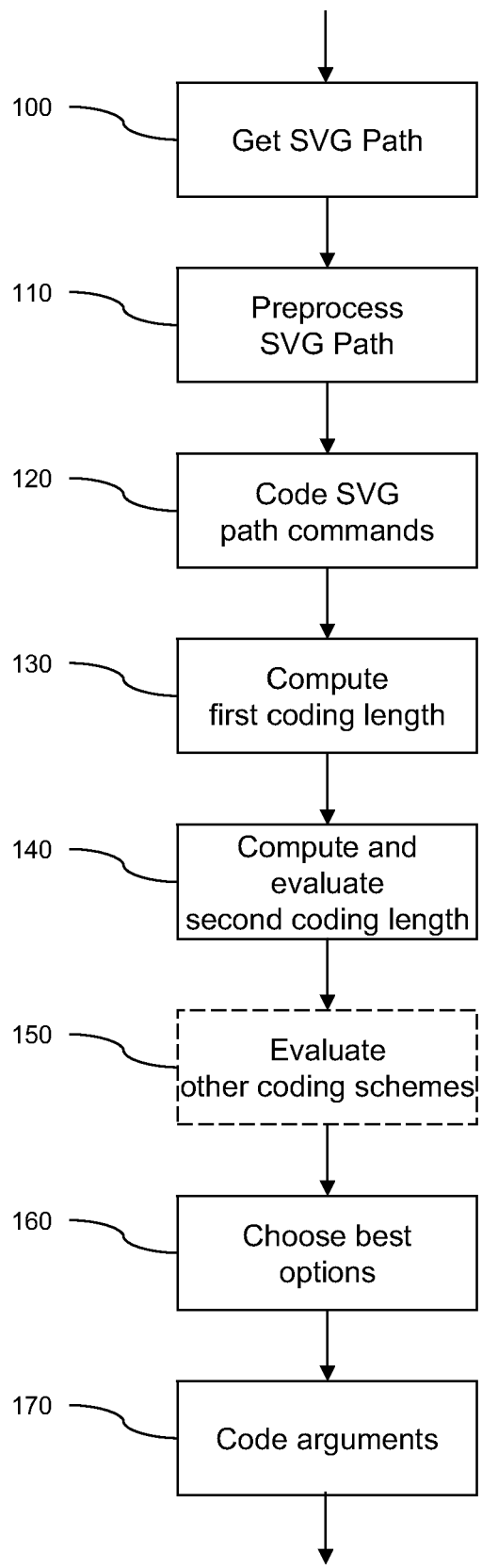
FIG. 1 illustrates an example of an algorithm that can be used for coding an SVG path according to the invention.

According to an embodiment of the invention, SVG path data is coded efficiently by rewriting path data in order to use an SVG representation adapted to the particular coding format of the invention. Moreover, path commands and arguments are coded separately. All commands are coded together in a first part while the arguments are coded in a second part.

In the preferred embodiment, data to code, e.g. path arguments, are coded using fixed-point coding schemes wherein the float values are converted to integers by scaling them. As is known, a fixed-point coding scheme is defined by a scaling factor and a coding length representing the number of bits used to code the values. In the following description, the coding length refers to a number of bits used to code the absolute value of an integer.

Several scaling factors and coding lengths are used to code all the values of the SVG path.

Therefore, to code a float value, a first step consists in applying the scaling factor associated to the used fixed-point coding scheme, allowing the conversion of the float value into an integer value. According to the preferred embodiment of the invention, the scaling factor used is preferably such as to prevent any loss during the conversion. The scaling factor used is preferably a power of ten.

In a second step, the obtained integer value is binary coded using a predetermined number of bits.

For example, considering the float value 3.14, the scaling factor is at least 100 to obtain an integer value such as 314. For example the scaling factor could be 1000, giving the integer value 3140. The value 314 can be coded in a binary format as follows: 100111010. In this example the scaling factor is 100 and the coding length is 9 bits. Any other binary coding formats can be used to code this value based on other scaling factors. This will only change the number of leading zeros.

It is to be noted here that even if the given examples of path arguments mainly concern decimal values that are encoded using a fixed-point coding scheme, the invention can be applied, for example, to integer arguments. In such case, the coding schemes used are integer coding schemes with different coding lengths. Such an integer coding scheme is similar to a fixed-point coding scheme, the main difference being that it has no scaling factor (in fact it can be considered as having an implicit scaling factor of one).

A main characteristic of the invention lies in the use of a coding technique based upon several coding schemes of the same type but with different parameters for coding a single path.

In the preferred embodiment, the coding scheme used is a fixed-point coding scheme. In particular, the inventors have established that using a coding technique with two fixed-point coding schemes gives good results. The first fixed-point coding scheme may be used for coding any values of the path whereas the second fixed-point coding scheme allows the coding of small values of the path. An important aspect of the invention lies in the choice of the parameters of the second fixed-point coding scheme.

As described above, several pre-processing steps are applied to an SVG path before it is coded for optimizing the path representation.

A first pre-processing step consists in rewriting the path using only relative coordinates. This means, firstly, updating the command names by replacing uppercase command names by lowercase command names (in the SVG path syntax, commands are specified using letters, for example, M or m, is used for moveto): each command has an absolute form, represented by an uppercase letter, and a relative form, represented by a lowercase letter. Secondly, all absolute coordinates are replaced by relative coordinates which are computed from the absolute coordinates. For example, the path "M 100 100 L 200 150 L 100 150 L 100 100" is converted to the equivalent relative path "m 100 100 l 100 50 l –100 0 l 0 –50". This has the first advantage of reducing the number of commands used. Moreover, it reduces the size of the number to code since the values of the relative coordinates are generally smaller than the values of the corresponding absolute coordinates.

It should be noted here that according to the SVG specifications, if the first path command is a relative path command, it is interpreted as an absolute command. This allows the pre-processing step to rewrite all commands even the first one.

According to a second pre-processing step, the commands of the SVG path are analyzed to be replaced by shortcuts, if possible, to use a more compact representation. For the sake of illustration, the "lineto" command, denoted "l", can be replaced by the "horizontal-lineto" shortcut, denoted "h", if the specified line is horizontal. For example, the command "l 5 0" can be replaced by the command "h 5" which produces the same graphical result. Therefore, the number of arguments in the original path can be reduced by using the most specific commands.

After having pre-processed the SVG path, it is coded. To that end, the coding length associated with a first and a second fixed-point coding scheme is computed. Next, float values are coded using the coding scheme giving the best compression ratio.

The coding length of the second fixed-point scheme is preferably based upon a set of predefined values which give good compression results. This also makes it possible to decrease the computation time needed to determine the coding length of the second fixed-point coding scheme. The predefined values of the set of values can be computed using one or more of the following steps:

computing predefined coding lengths for the second fixed-point coding scheme by decreasing the coding length of the first fixed-point coding scheme by predefined amounts;

computing predefined coding lengths for the second fixed-point coding scheme by decreasing the coding length of the first fixed-point coding scheme by predefined amounts from two to seven; and, choosing a coding length for the second fixed-point coding scheme equal to zero.

The first and second fixed-point coding schemes may also be compared to other coding schemes, such as a reference coding scheme in which a set of data is coded by reference to another set of data previously coded, to identify the most appropriate coding scheme for each argument or set of arguments.

FIG. 1 illustrates an example of an algorithm that can be used to code an SVG path according to an embodiment of the invention. An SVG path is considered as a part of a structured document (in SVG format) to code, comprising several pluralities of data to code, namely commands and arguments.

After having obtained the SVG path to code in a first step (step 100), it is pre-processed as described above (step 110). Advantageously, a last pre-processing step consists in determining which arguments should be coded according to a specific coding scheme, that is to say a coding scheme different from the fixed-point coding scheme. For example, the arguments of the first command, which are absolute coordinates, are preferably coded using a particular scheme. Likewise, each Boolean argument is coded using a one bit value. In the following description, it is assumed that the arguments to be coded are only those that are to be coded using a fixed-point coding scheme.

In a following step, the SVG path commands are coded (step 120). Several coding methods can be used. Basically, each command is coded with a predetermined number of bits. For example, since ten relative commands exist, they can be coded over four bits (representing sixteen different possible commands). Preferably, the unused values (resulting from the difference between the real number of commands and the number of commands that could be coded using the predetermined number of bits) are used to code the number of occurrences of the previous command. Alternatively, the commands are coded according to variable length coding, such as Huffman coding, where the most frequently used commands are coded over a smaller number of bits than the less frequently used ones.

Next, the coding length of the first fixed-point coding scheme is computed (step 130). This may be done by determining the maximum number of decimal figures used by any one of the arguments (except those not coded using a fixed-point coding scheme) for computing the scaling factor to be used and then by evaluating the maximum absolute value of the scaled arguments. The coding length of the first fixed-point coding scheme is then determined by the maximum absolute value of the scaled arguments.

In a following step, the computation of the parameters of the second fixed-point coding scheme to use is performed (step 140) according to the parameters of the first fixed-point coding scheme. This step is described in more detail with reference to FIG. 3.

The inventors have observed that in almost all cases, the scaling factor associated with the second fixed-point coding scheme should be similar to the one for the first fixed-point coding scheme. The main exception is when the second fixed-point coding scheme is used to code the value zero. However, in such a case, whatever scaling factor is applied to the value zero, it remains zero. Therefore the scaling factor has no importance.

The inventors have also observed that in almost all cases, the best coding length for the second fixed-point coding scheme is either equal to zero in order to code only the value zero or to the coding length of the first fixed-point coding scheme decreased by a number varying from two to seven. More specifically, the inventors have observed that using a coding length (for the second fixed-point coding scheme) equal to zero is the best option in about 12% of cases and using a coding length equal to the coding length of the first fixed-point coding scheme decreased by a number varying from two to five is the best option in about 82% of cases.

An example of the steps that could be carried out to estimate an optimal value for the coding length of the second fixed-point coding scheme is described in detail with reference to FIG. 3.

At the end of step 140, the coding length of the second fixed-point coding scheme is determined and thus the associated coding cost or coding efficiency may be evaluated.

According to a particular embodiment, other coding schemes are evaluated (step 150). For the sake of illustration, a third coding scheme can be a reference coding scheme that consists in coding one or more arguments by reference to a previous occurrence of the same arguments or even to a previous occurrence of the same arguments having the opposite sign. In this case, reference coding consists in coding repetitions of data patterns. The coding cost or coding efficiency of the reference coding scheme is evaluated and compared to that of the fixed-point coding schemes. For each argument, the closest previous reference is searched for and the reference index is stored. The reference index is preferably stored as the difference between the index of the current argument and the index of the referred to argument minus one. Once all the reference indexes have been determined, the arguments that should be coded using the indexes and the arguments that should be coded using one of the fixed-point coding schemes are identified, according to the length of the stored indexes. Only the indexes whose length is less than the coding length of the first fixed-point coding scheme minus one are considered so as to consider only the reference indexes allowing improved coding compared to the first fixed-point coding scheme.

For each reference index considered, the number of arguments that can be coded is determined as well as its coding cost. This enables selection of the best reference index for the current SVG path.

It is also possible to use a third fixed-point coding scheme, with different parameters that may again be computed according to the parameters of the first and the second fixed-point coding scheme.

In a following step, the best coding scheme is selected (step 160). This is achieved by evaluating the coding cost of all the coding schemes considered, in relation to at least one item of the plurality of data to code. Furthermore, for each item of data to code, the coding scheme to be applied is chosen as a function of the coding cost: the coding cost for several schemes is computed and compared, and the coding scheme providing the lowest coding cost is applied. The coding cost is representative of the coding efficiency.

It is to be noted here that having more than two coding schemes, including the first and second fixed-point coding schemes, increases the computational task since the best coding cost for each argument has to be found by comparing its coding cost for each coding scheme. Likewise, the number of bits used to code the chosen coding scheme increases. Indeed, for each argument to be coded, it is necessary to indicate which coding scheme is used, so that the decoder can decode it.

When two coding schemes are used, only one bit is required to code the coding scheme used for each argument. When more than two coding schemes may be used, more than one bit is needed to indicate the coding scheme to the decoder for each argument. If more than two coding schemes may be used, variable length coding, such as Huffman coding, may be used to indicate the coding scheme used.

Finally, the arguments are coded (step 170), each argument being coded by applying the coding scheme selected in step 160 and the associated parameters previously determined.

To allow efficient decoding of the arguments, the values indicating the coding parameters are firstly coded. This includes all the parameters of the coding schemes that may be used such as the scaling factors and the coding lengths.

Optionally, the coding step may be performed as described with reference to FIG. 4.

Figure 2:
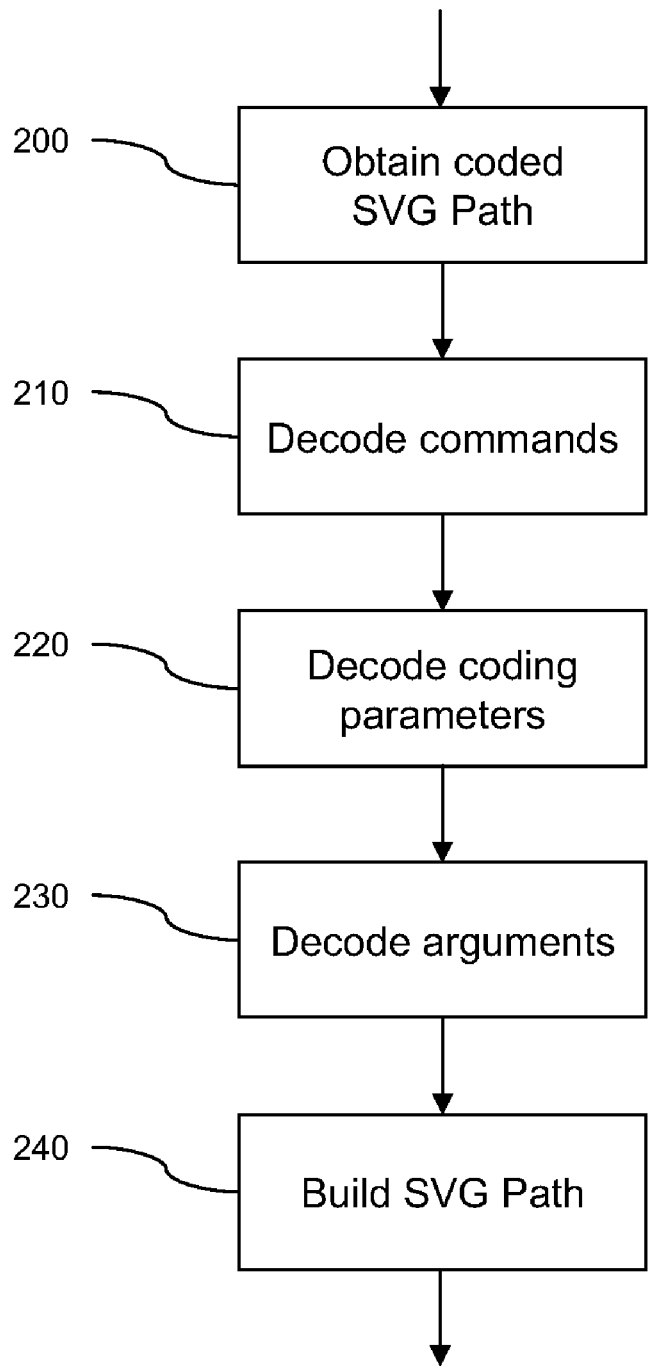
FIG. 2 illustrates an example of an algorithm that can be used for decoding an SVG path coded according to the invention.

FIG. 2 illustrates an example of an algorithm that can be used for decoding an SVG path coded according to an embodiment of the invention.

After having retrieved the coded SVG path in a first step (step 200), the path commands are decoded (step 210). Path command decoding depends upon the coding. The decoding steps for the commands correspond to the reverse of the coding steps. Since the command coding and decoding algorithms are standard, they are not disclosed in detail here.

Next, the coding parameters of the coding schemes, that is to say the parameters describing the options used for coding the arguments, are decoded (step 220). According to a particular embodiment, this step comprises the step of decoding which coding schemes are used for the coded SVG path, the step of decoding the coding length and the scaling factor (corresponding to the number of decimals) of the first fixed-point coding scheme and the step of decoding the coding length of the second fixed-point coding scheme and an optional indication of the scaling factor of the second fixed-point coding scheme. The coding factor of the second fixed-point coding scheme may be equal to the scaling factor of the first fixed-point encoding scheme, in which case a simple indication is sufficient. In the preferred embodiment, the scaling factor of the second fixed-point encoding scheme is taken as being equal to the scaling factor of the first fixed-point coding scheme, so there is no need to encode any information relating to the scaling factor of the second fixed-point coding scheme.

Decoding the coding parameters enables the decoder to know which coding schemes and which parameters were used for coding each argument.

Then, the arguments are decoded (step 230). For each argument, a first sub-step consists in determining how it was coded, that is to say what coding scheme has been used.

The command corresponding to the argument is used to determine its type (for example to determine whether it is a float value or a Boolean value) and to determine whether or not it is coded in a specific way (for example the first two arguments are coded in a specific way). If the argument is coded in a specific way, it is decoded accordingly.

If the argument is not coded in a specific way, the coding scheme flag is analyzed to determine which of the coding schemes has been used. For the sake of illustration, the flag having the value zero may correspond to the arguments that are coded using the first fixed-point coding scheme while the flag having the value one is used to identify the arguments coded with the second fixed-point coding scheme. Knowing which coding scheme was used allows the arguments to be decoded accordingly.

It should be noted that the commands are used not only to determine the type of an argument and whether or not it was coded in a specific way, but also to determine how many arguments should be decoded since all the SVG path commands have a fixed number of arguments.

Finally, the SVG path is built according to the decoded commands and arguments (step 240). Depending upon the SVG usage, the resulting SVG path can either be generated as a string or using a more specific representation (for example to transmit it to a rendering unit).

Figure 3:
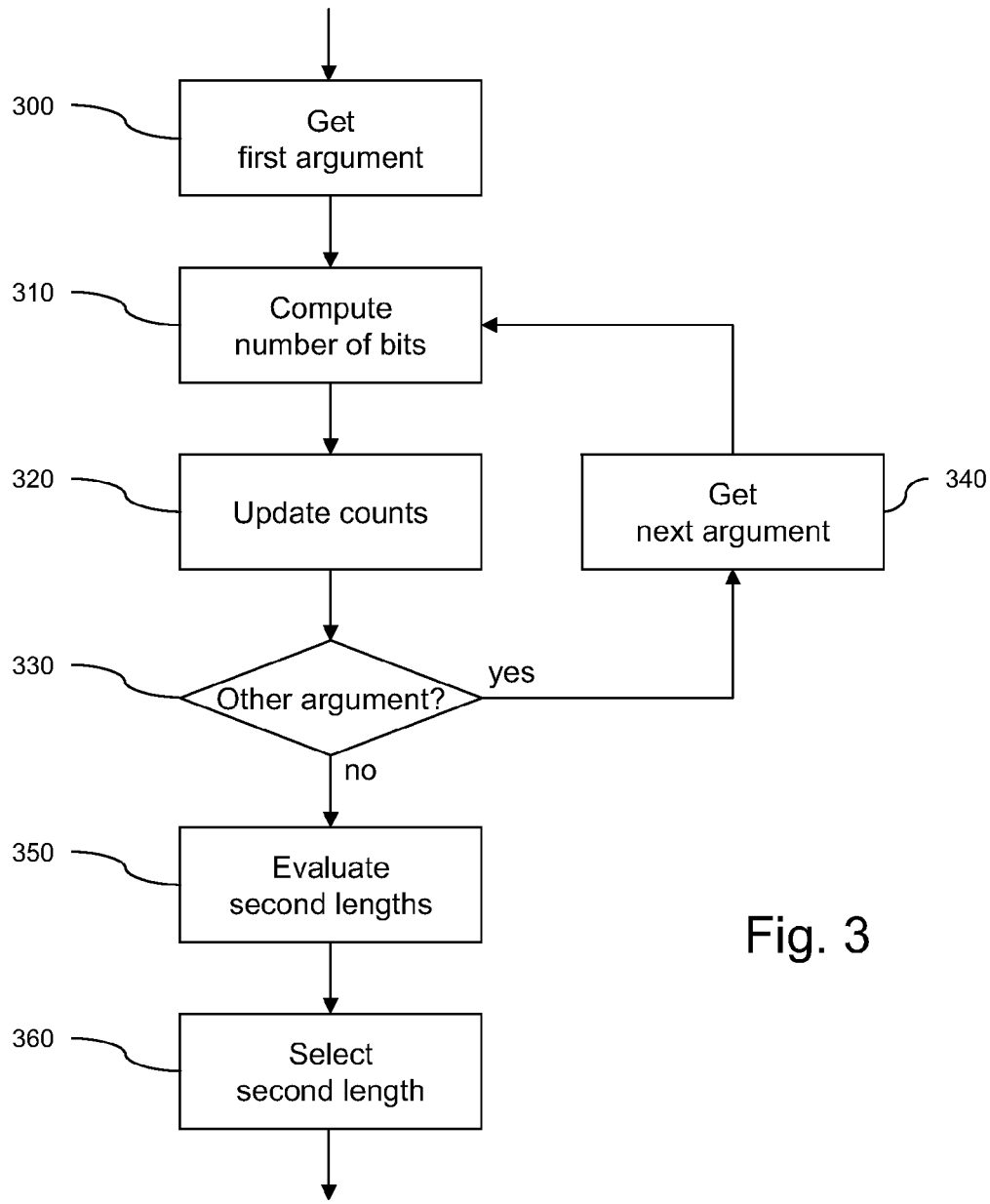
FIG. 3 illustrates an example of an algorithm for evaluating the coding length of a second fixed-point coding scheme used for coding an SVG path.

FIG. 3 illustrates an example of an algorithm for determining the coding length of a second fixed-point coding scheme used for coding an SVG path.

This algorithm can be used by the coding algorithm described with reference to FIG. 1 (step 140). As stated previously, the inventors have established that using a common scaling factor for the first and second fixed-point coding schemes generally gives good results. Therefore, the aim of the algorithm depicted on FIG. 4 is to evaluate the coding length of the second fixed-point coding scheme when the scaling factor is the same as the one of the first fixed-point coding scheme. However, this algorithm could easily be adapted to determine also other scaling factors at the cost of an increased processing time.

The algorithm starts by initializing a coding length counting table that is used for counting the number of arguments that can be coded with each predetermined coding length. All the values of this table are set to zero. The coding length counting table can have entries for all the coding lengths from 0 to the coding length of the first fixed-point coding scheme. Alternatively, it can be reduced to have entries only for the coding lengths of interest. Preferably, only the coding lengths of interest are considered so as to optimize the required memory and processing time.

After having been obtained, the first item to code (first argument) is selected (step 300).

Next, in a following step, the number of bits needed to code this argument is computed (step 310). The number of bits needed to code an argument with a given coding scheme is representative of the coding efficiency of that coding scheme. This is carried out, for example, by comparing the integer representation of the argument with the maximum integer that can be coded with each coding length. As described above, the integer representation of the argument is obtained by first applying the scaling factor to the argument value and then by computing its absolute value.

For the sake of illustration, considering the value "−12" and a scaling factor equal to ten, its integer representation is "120" which needs seven bits to be coded ("1111000"). For the value zero, zero bits are needed, provided that the value encoding is preceded by an indication of a zero-length fixed-point encoding.

The coding length counting table is then updated according to the selected argument (step 320). To that end, the value of the table entry corresponding to the coding length computed at the previous step is increased by one. If the table is optimized to contain only possible coding lengths dependent on the coding length $L_1$ of the first fixed-point coding scheme (for example from $L_1$−7 to $L_1$−2) and does not contain any entry for the computed coding length, several cases are envisaged. If the computed length is smaller than $L_1$−7, which is the smallest coding length recorded in the table, the entry corresponding to this smallest coding length is increased. No entry is updated if the computed coding length is greater than the greatest coding length of the table, i.e. greater than $L_1$−2 in this example, since in this case, the value should be coded using the first fixed-point coding scheme.

For the sake of illustration, if an argument is equal to "−12", requiring at least seven bits to be coded, if the coding length of the first fixed-point coding scheme is equal to eight bits, and if the optimized coding length counting table does not contain any entry corresponding to the coding length of seven nor eight, the optimized coding length counting table is not changed by processing this argument. In the case in which the value zero is to be coded, the optimized coding length counting table is updated with an argument equal to zero, requiring zero bits to be coded, by increasing the entry corresponding to the coding length of zero.

Next, a test is performed to determine whether or not all the arguments have been processed (step 330). If at least one argument remains, the next argument is selected (step 340) and the last two steps (steps 310 and 320) are repeated.

If all the arguments have been processed, the coding cost is evaluated for each considered coding length of the second fixed-point coding scheme, that is to say, preferably, for each coding length of the coding length counting table.

According to the number of arguments $NbAr_{CL(i)}$ that may be coded for each coding length $CL(i)$, the coding cost coding_cost$_{CL(i)}$ associated with the coding length $CL(i)$ may be evaluated as follows, $$\text{coding\_cost}_{CL(i)} = NbAr_{CL(i)} * (CL(i)+2) + (NbTAr - NbAr_{CL(i)}) * (CL_{first}+2)$$

wherein NbTAr represents the number of arguments to be coded.

The value $NbAr_{CL(i)} * (CL(i)+2)$ corresponds to the number of bits used to code the arguments with the second fixed-point coding scheme while the value $(NbTAr - NbAr_{CL(i)}) * (CL_{first}+2)$ corresponds to the number of bits used to code the argument with the first fixed-point coding scheme. It should be noted that the value '2' added to the coding length of the first and second fixed-point coding schemes corresponds to the coding of the sign of the argument and of the flag indicating which of the first or second coding schemes is used.

For each coding length, the number of arguments to be coded with the second fixed-point coding scheme based upon that coding length is determined by adding the value contained in the counting table, corresponding to that coding length, to all the values of the counting table corresponding to the smaller coding lengths. In this embodiment, the coding scheme to be used for a given argument is determined at the same time as the parameter of the second fixed-point coding scheme.

Finally, the coding length of the second fixed-point coding scheme is selected (step 360). The selected coding length of the second fixed-point coding scheme is the coding length that corresponds to the smallest coding cost.

It should be noted here that throughout this algorithm only the arguments to be coded using a fixed-point coding scheme are evaluated. As stated above, the first two arguments which are absolute coordinates may be coded in a specific way.

Likewise, the inventors have established that in several cases, the values of coordinates of the "moveto" command are very different from the others. Therefore, the compression of such coordinates adversely impacts the compression results. A solution to this problem is to code all the coordinates of the "moveto" command in their own specific way, either using a specific coding such as the one described in the following example or using a specific fixed-point coding scheme.

Alternatively, a better solution is to code the coordinates of the "moveto" command either using the coding scheme used for the other coordinates, if it is possible, or to code these coordinates using a specific coding scheme. To specify which coding scheme is used for the coordinates of the "moveto" command, a first solution consists in adding a specific flag before each coded coordinates of the "moveto" command. Another solution is to have two different coding schemes for the "moveto" command itself: a first coding scheme specifies that the coordinates of the "moveto" command are coded in a specific way whereas the second one specifies that the coordinates of the "moveto" command are coded as the other arguments. This latter solution is the preferred one.

Figure 4:
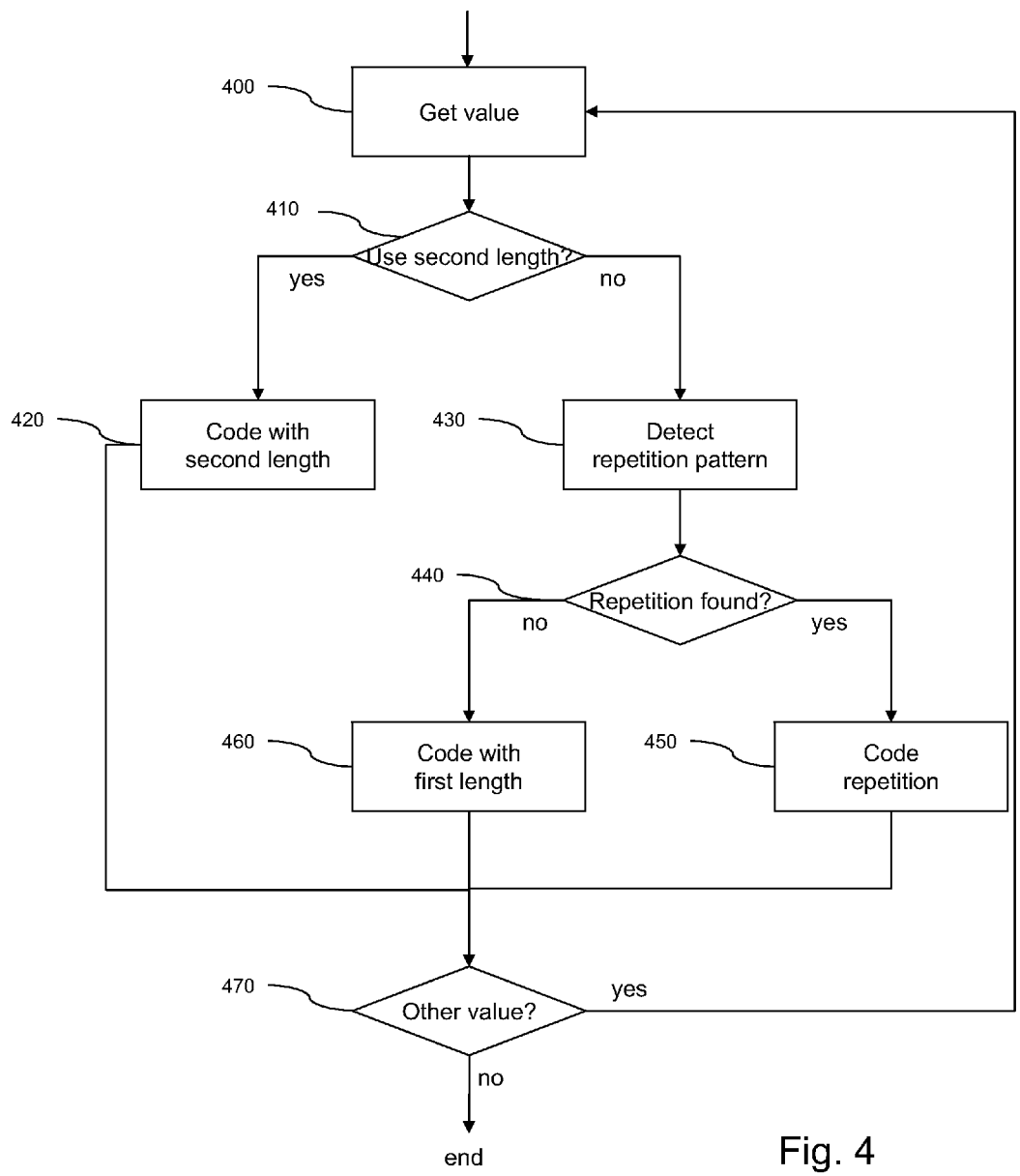
FIG. 4 illustrates an example of an enhanced argument coding algorithm.

FIG. 4 depicts an example of an enhanced argument coding algorithm that provides an efficient way of coding arguments. It can be used to perform the step 170 of FIG. 1.

First of all, it should be observed that all the values that can be coded efficiently according to the second fixed-point coding scheme are not coded according to the first fixed-point coding scheme. In other words, this means that a set of coded values of the first fixed-point coding scheme are never used in practice. Therefore, an optimization is to use these particular values that are normally not used.

In a particular embodiment, the first fixed-point coding scheme is modified in such a way that instead of coding a given argument value directly using the first fixed-point coding scheme, its absolute value is firstly decreased by the maximum value that can be coded using the second fixed-point coding scheme. This allows the maximum value coded with the first fixed-point coding scheme to be decreased, and, in some cases, it may also allow reduction of the coding length of the first fixed-point coding scheme. For the sake of illustration, if the maximum argument value is 128, which needs 8 bits to be coded, decreasing it by one (the maximum value that can be coded by the second fixed-point coding scheme) allows the coding length of the first fixed-point coding scheme to be reduced to seven.

According to a second embodiment, these particular values are used to code information other than the arguments, for example to indicate the number of occurrences of the same value. For instance, the value zero can be used to specify that the preceding value is repeated twice, the value one can be used to indicate three occurrences of the preceding value, and so on. According to another example, these particular values are used to indicate repetitions of a sequence of values. For instance, the value zero can be used to indicate the repetition of the two preceding values, the value one can be used to indicate that the three preceding values are repeated, and so on. More complex coding schemes can be used to code more complex pattern repetitions. However, it should be noted that coding the repetition of only one value does not make sense since it has the same coding cost as coding this value directly. It should also be noted that when using these particular values for specific meanings, the bit used to code the sign is also available.

An example of a more generic repetition of data patterns is the following. Firstly, the bit sign is used to specify if a single value is repeated multiple times or if a set of values is repeated multiple times.

Then, in the case of the repetition of a single value, half the available bits (rounded-up) are used to code the position of the repeated value, that is to say the distance between the repeated value and the current position, and the other half (rounded-down) to code the number of repetitions.

In the case of the repetition of a set of values, half the available bits (rounded-up) are used to code the position of the last value of the set, that is to say the distance between the last value of the set and the current position, and the other half (rounded-down) to code the number of values in the set.

Another example for using these particular values is to code values by differences. However, as stated previously, at least two arguments need to be coded at once for the sake of efficiency. Nevertheless coding schemes similar to the ones given above for dealing with repetitions allow this to be done.

According to a third embodiment, these particular values are used to code the flags for a set of values: instead of coding, over one bit, the flag specifying which coding scheme is used for each value, a set of flags can be coded at once. The number of coded flags must be greater than the length of the first fixed-point coding scheme.

An example of such a coding technique, working only when two different coding schemes are used, is the following: the sign bit is used to specify one of the two coding schemes. Then the first half of the available bits (rounded-up) is used to code a number of values coded using the coding scheme specified by the sign bit. The other half of the available bits (rounded-down) is used to code a number of values coded using the other coding scheme. Such a coding technique can also be extended to describe the sign of the values.

FIG. 4 describes how these particular values can be used to code repetitions in the arguments.

After having obtained the next value to code (step 400), a test is performed to determine whether or not it should be coded with the second fixed-point coding scheme (step 410). If the value to code is to be coded with the second fixed-point coding scheme, the value is coded accordingly (step 420).

If the value to code is not to be coded with the second fixed-point coding scheme, an analysis is conducted on previously coded arguments to detect any pattern repetition as described above (step 430). In a general way, the algorithm looks for the current value to code and the following ones and checks whether or not a set of similar values has been previously coded.

If a pattern repetition is detected and if it is compatible with the pattern repetition coding scheme (step 440), it is coded accordingly (step 450). If this is not the case, the value is coded according to the first fixed-point coding scheme (step 460).

After the value has been coded at step 420, 450 or 460, a test is performed to determine whether or not at least one value remains to be coded (step 470). It should be noted here that if a pattern repetition has been detected and coded, the next possible value to code is the one that follows the last coded value of the pattern.

If at least one value remains to code, the preceding steps (steps 400 to 470) are repeated. The algorithm stops when all the values have been coded.

For the sake of illustration an example of coding an SVG path is given below. The SVG path to code here is the following, M 14.0,70.9 L 14.0,55.0 L 2.0,71.0 L 14.0,70.9 z As described above, the SVG path is converted, before being coded, so as to refer to relative commands and coordinates. After such a conversion, the SVG path appears as follows, m 14.0,70.9 l 0.0,−15.9 l −12,16 l 12,−0.1 z Then, in a next step, the commands are coded. The list of commands is here the following, m l l l z which can be transformed as follows using run-length coding, m l*3 z The coded format of this command list can be expressed as follows, 0000 0100 (the number of coded commands, 4)

0000 . . . (the coded command m)

. . . 0010 (the coded command l)

1011 . . . (the number of occurrences of the previous command, 3)

. . . 0001 (the coded command z)

Each number of this coding format represents one bit while dots correspond to bits not used for coding the data described on the line.

In this coding format, the number of commands is coded at the beginning. It is coded using a variable length integer coding scheme. In this case, the number of commands (either true commands or occurrence numbers) is four, which is coded using one byte.

Afterwards, each command or occurrence number is coded over 4 bits. For example, the second line represents the coding of the command "m" with the value zero over four bits.

As there are only ten relative path commands, they are coded using the values from zero to nine. The six remaining values (ten to fifteen) are not used to code commands. Therefore, as described above, these unused values can be used to code multiple command repetitions. For example, the value ten can be used to code one repetition, that is to say two occurrences of the previous command, eleven to code two repetitions, that is to say three occurrences of the previous command, and so on.

Therefore, the binary representation of the commands is 0000010000000101 0110001.

In a following step, the arguments of the SVG path are coded.

As described above, since the arguments of the first command are absolute arguments, they are coded specifically.

Therefore, the two first values 14.0 and 70.9 are coded here as follows,
0... (the sign of the first argument)
.000 0... (the number of decimals of the first argument, 0)
...001 (the length of the first coded argument, 1 byte)
0000 1110 (the value of the first argument, 14)
0... (the sign of the second argument)
.000 1... (the number of decimals of the second argument, 1)
...010 (the length of the second coded argument, 2 bytes)
0000 0010 (the value of the first byte of the second argument, 2)
1100 0101 (the value of the second byte of the second argument, 197)

Each number is coded by first coding its sign over one bit. Next, the number of decimals is coded over four bits. The value is then coded as an integer and is therefore scaled by a power of ten to avoid any decimals. Considering the value 14.0, it is not scaled (the value to code is 14). It is coded over one byte. Therefore, the coding length, in bytes, is one. It is coded over 3 bits. Considering the value 70.9, it is scaled using a scaling factor of ten. Therefore, the value to code is 709. It is coded over two bytes (the coding length is two). The two byte values are 2 and 197 (2*256+197=709).

Therefore, the binary format of the first two arguments is 00000001000011100000010100000001011000101.

After having specifically coded the first two arguments, the remaining arguments are coded using the fixed-point coding schemes as described above.

For the sake of illustration, the first fixed point coding scheme uses a scaling factor of ten and a length of 8 bits to code each value. A second fixed-point coding scheme is used. It shares the same scaling factor of ten but uses a length of only 1 bit to code each value. These coding parameters are coded as follows,
1000... (the length of the first fixed-point coding scheme, 8)
...001. (the scaling factor of the first and second fixed-point coding schemes, expressed in number of decimals, 1)
...1
01... (the length of the second fixed-point coding scheme, 1, coded with the value 5)

The length of the first fixed-point coding scheme, also called first fixed-point coding bit length, is coded here over four bits (there are some mechanisms for coding a length greater than sixteen, in case the coding length of first fixed-point coding scheme should ever be larger). Next, the scaling factor, representing the number of decimals, is coded over three bits. The length of the second fixed-point coding scheme is coded over three bits, using the value five. This value corresponds to the first fixed-point coding bit length from which the second fixed-point coding bit length and the value two are subtracted.

This coding scheme is optimized. It comprises two reserved values. The first one, equal here to seven, is used to specify that no second fixed-point coding scheme is used and a second one, equal here to six, for specifying that the second fixed-point coding bit length is equal to zero. This latter second fixed-point coding bit length means that only the value zero can be coded with the second fixed-point coding scheme. However, since this value is coded using zero bits, it is very useful when arguments equal to zero appear frequently in an SVG path. The remaining values are used to specify the second fixed-point coding bit length from the first fixed-point size minus two to the first fixed-point size minus seven.

Therefore, the binary format of the coding parameter is 1000001101.

Each remaining argument is coded using the best fixed-point coding scheme. The flag indicating the use of the first fixed-point coding scheme is here equal to zero while the flag indicating the use of the second fixed-point coding scheme is here equal to one. For the sake of simplicity in this example, each coded value starts on a byte boundary. However, in real conditions, all these coding values should be packed together, without leaving any padding bits, in order to achieve better compression.

The argument 0.0 is coded using the second fixed-point size as follows,
1... (the flag indicating which of the first and second fixed-point coding schemes is used, 1)
.0... (the sign)
...0... (the value of the scaled argument, 0)

The first bit is used as a flag to specify which of the first and second fixed-point coding schemes is used. Since the second fixed-point size is used, the flag is equal to one. The following bit is the sign. Next, the value is coded using 1 bit, as specified by the second fixed-point coding scheme.

Next, the argument −15.9 is coded using the first fixed-point coding scheme as follows,
0... (the flag indicating which fixed-point coding scheme is used, 0)
.1... (the sign)
...10 0111
11... (the value of the scaled argument, 159)

Likewise, the argument −12.0 is coded using the first fixed-point coding scheme as follows,
0... (the flag indicating which fixed-point coding scheme is used, 0)
.1... (the sign)
...01 1110
00... (the value of the scaled argument, 120)

Similarly, the argument 16.0 is coded using the first fixed-point coding scheme as follows,
0... (the flag indicating which fixed-point coding scheme is used, 0)
.0... (the sign)
...10 1000
00... (the value of the scaled argument, 160)

Likewise, the argument 12.0 is coded using the first fixed-point coding scheme as follows,
0... (the flag indicating which fixed-point coding scheme is used, 0)
.0... (the sign)
.01 1110
00... (the value of the scaled argument, 120)

Finally, the argument −0.1 is coded using the second fixed-point coding scheme as follows,
1... (the flag indicating which fixed-point coding scheme is used, 1)
.1... (the sign)
...1... (the value of the scaled argument, 1)

Therefore, the binary format of the arguments coded according to the first and second fixed-point coding schemes is
10000000011001111100000001011110000000000001010-0000000000001111000000000011100000.

According to the invention, this coded SVG path requires only 16 bytes while the original path requires 49 bytes, which is only 33% percent of the original size.

The described coding technique may be applied to other SVG values that contain lists of numeric values. For example, it can be used to code a list of points describing polygons, or a list of time values used for animations. However, for particular data, it can be useful to consider specific coding schemes. For example, for time values used in animations, it may be of interest to consider coding each time value as a difference relative to the previous value, and to use repetition mechanisms to code efficiently multiple occurrences of the same values. For instance, the commonly found pattern of time values, keyTimes="0.0 0.1 0.2 0.3 0.4 0.5 0.6 0.7 0.8 0.9 1.0" may be coded as follow, start Value=0.0; delta=0.1 repeated 10 times It should also be noted that although the coding method of the invention is described here in relation to the coding of SVG paths, it can also be applied to other graphic description languages using an XML syntax, such as Microsoft Silverlight (Silverlight is a trademark) or Adobe Mars. It can also be applied to graphics description language using other syntaxes, such as Adobe Postscript (Postscript is a trademark), Adobe PDF (PDF is a trademark), or Autodesk DXF (DXF is a trademark). Moreover, the invention can also be applied to graphical user interface description languages, such as XAML (standing for eXtensible Application Markup Language), XUL (standing for XML-based User interface Language), UIML (standing for User Interface Markup Language), Adobe Flex (Flex is a trademark), and Open Laszlo.

Furthermore, the invention can be applied to other languages used for describing multimedia content, and specifically to code lists of temporal values. An example of such languages is SMIL (standing for Synchronized Multimedia Integration Language). The invention can also be applied to three-dimensional graphics description languages, specifically to code lists of three-dimensional points or three-dimensional paths. An example of such languages is X3D (standing for Extensible 3D).

When comparing coding efficiency (step 160 of FIG. 1), some cases may be optimized. Specifically, when checking the effectiveness of using reference coding schemes, experiments have shown that for short paths, with a size up to a limit of 150 to 500 characters, reference coding schemes could be more efficient than using a second fixed-point coding scheme. Therefore, for such paths, reference coding schemes can be evaluated and compared to other coding schemes. However, for long paths, having more than 5000 characters, the result obtained with reference coding schemes is generally less efficient than that obtained using a second fixed-point coding scheme. Therefore, it is not useful to evaluate the results that may be obtained by applying reference coding schemes to long paths.

The reference coding schemes described above give good results. However, other more complex reference coding schemes can also be used. For example, the reference could specify whether the referenced value is equal to the current value or if it is equal to the opposite of the current value. Another example is to particularize the references depending upon the argument type. For instance, an abscissa coordinate would only be defined as a reference to another abscissa coordinate.

Similarly, it could be efficient to use particularized fixed-point coding schemes depending upon the argument types. For example, a first fixed-point scheme can be used to code abscissa coordinates while a second fixed-point coding scheme can be used to code ordinate coordinates.

It should also be noted that the SVG path pre-processing steps described above are lossless, that is to say that these pre-processing steps may change the syntax of the SVG path but will not change the resulting graphics. However, the invention can also be applied with lossy pre-processing steps. For example, the precision of the coordinates can be reduced to increase the overall compression ratio.

Figure 5:
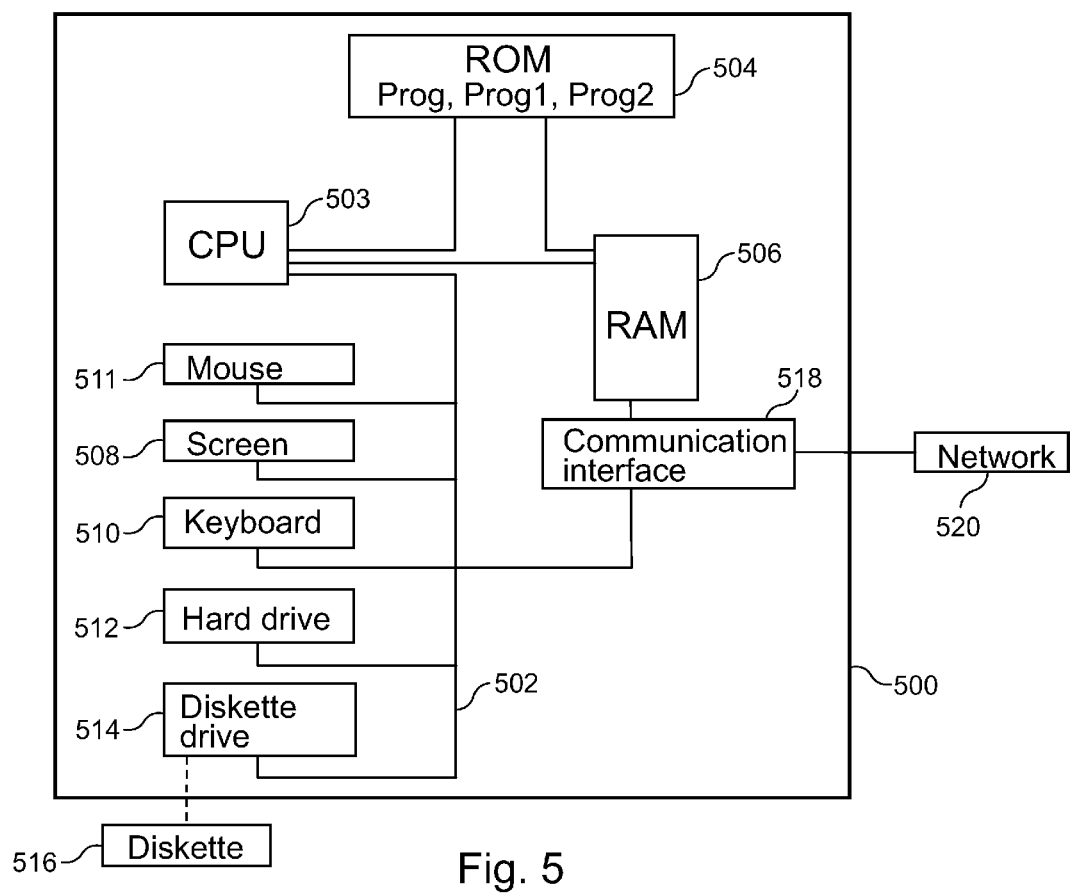
FIG. 5 illustrates an example of an apparatus making it possible at least partially to implement the invention.

An apparatus implementing the invention or a part of the invention is illustrated in FIG. 5. The device 500 is for example a micro-computer, a workstation, a personal digital assistant, or a mobile telephone.

The apparatus 500 comprises a communication bus 502 to which there are connected:
  a central processing unit or microprocessor 503 (CPU);
  a read-only memory 504 (ROM) able to contain the programs "Prog", "Prog1" and "Prog2";
  a random access memory or cache memory (RAM) 506, comprising registers adapted to record variables and parameters created and modified during the execution of the aforementioned programs; and,
  a communication interface 518 connected to a distributed communication network 520, for example the Internet, the interface being able to transmit and receive data.

Optionally, the apparatus 500 may also have:
  a screen 508 for viewing data and/or serving as a graphical interface with the user, who will be able to interact with the programs according to the invention, using a keyboard 510 or any other means such as a pointing device, for example a mouse 511, an optical stylus, a touch screen or a remote control device;
  a hard disk 512 able to contain the aforementioned programs "Prog", "Prog1" and "Prog2" and data processed or to be processed according to the invention;
  a floppy disk drive 514 adapted to receive a floppy disk 516 and to read or write thereon data processed or to be processed according to the invention; and,
  a reader for memory cards adapted to read or write thereon data processed or to be processed according to the invention.

The communication bus affords communication and interoperability between the different elements included in the apparatus 500 or connected to it. The representation of the bus is non-limiting and, in particular, the central processing unit is capable of communicating instructions to any element of the apparatus 500 directly or by means of another element of the apparatus 500.

The executable code of each program enabling the programmable apparatus to implement the processes according to the invention may be stored, for example, on the hard disk 512 or in read-only memory 504.

According to a variant, the floppy disk 516 can contain data as well as the executable code of the aforementioned programs which, once read by the apparatus 500, will be stored on the hard disk 512.

As a second variant, the executable code of the programs can be received by the intermediary of the communication network 520, via the interface 518, in order to be stored in an identical fashion to that described previously.

The floppy disks can be replaced by any information carrier such as a compact disc (CD-ROM) or a memory card. Generally, the floppy disks may be replaced by information storage means, which can be read by a computer or microprocessor, integrated or not into the apparatus, which may possibly be removable, and which are adapted to store one or more programs whose execution permits the implementation of the method according to the invention.

More generally, the program or programs may be loaded into one of the storage means of the apparatus 500 before being executed.

The central processing unit 503 will control and direct the execution of the instructions or portions of software code of the program or programs according to the invention, these instructions being stored on the hard disk 512 or in the read-only memory 504 or in the other aforementioned storage elements. On powering up, the program or programs which are stored in a non-volatile memory, for example the hard disk 512 or the read-only memory 504, are transferred into the random-access memory 506, which then contains the executable code of the program or programs according to the invention, as well as registers for storing the variables and parameters necessary for implementation of the invention.

It should be noted that the communication apparatus comprising the device according to the invention can also be a programmed apparatus. This apparatus then contains the code of the computer program or programs for example fixed in an application specific integrated circuit (ASIC).

Naturally, in order to satisfy local and specific requirements, a person skilled in the art may apply many modifications and alterations to the solution described above, all of which, however, are included within the scope of protection of the invention as defined by the following claims.

The invention claimed is:

1. A method of binary coding of a structured document comprising at least a plurality of data items to code, the method comprising performing, by a computer, the steps of:
   determining at least one first parameter of a first coding scheme, said first parameter being a coding length;
   determining at least one second parameter of at least one second coding scheme according to said at least one first parameter of said first coding scheme, said first and said at least one second coding scheme being of the same type, wherein determining the second parameter comprises:
   initializing a counting table with coding length values less than the first parameter;
   counting a number of data items that can be respectively coded with each coding length value of the counting table;
   evaluating a respective coding cost associated with each particular coding length value of the counting table, based on the number of items that can be coded with the respective coding length value; and
   determining the second parameter as the coding length value associated with the smallest coding cost, and wherein the method further comprises:
   obtaining at least one item of data of said at least one plurality of data items;
   evaluating a coding efficiency of said at least one item of data according to said first and said at least one second coding schemes, wherein the coding efficiency is based on the respective coding cost of coding said at least one item of data;
   comparing said coding efficiency of said first and said at least one second coding schemes for coding said at least one item of data; and
   coding said data item according to the at least one second coding scheme, if said data item can be coded more efficiently by said second coding scheme.

2. The method according to claim 1 wherein said first and said at least one second coding schemes are fixed-point coding schemes.

3. The method according to claim 1, wherein the coding length values are computed by decreasing the first parameter by predefined amounts.

4. The method according to claim 3 wherein said amounts range from 2 to 7.

5. The method according to claim 1 further comprising a step of coding said second parameter.

6. The method according to claim 1 further comprising a step of pre-processing at least one item of data of said at least one plurality of data items to code.

7. The method according to claim 1, wherein a coding cost coding $\text{cost}_{CL(i)}$ for a coding length $CL(i)$ is evaluated as:

$$\text{coding cost}_{CL(i)} = NbAr_{CL(i)} * (CL(i)+2) + (NbTAr - NbAr_{CL(i)}) * (CL_{first}+2)$$

wherein:
   NbTAr represents the number of data item to be coded,
   $NbAr_{CL(i)}$ represents the number of data items that can be coded with the coding length $CL(i)$, and
   $CL_{first}$ is the first value of the coding length.

8. The method according to claim 1, wherein, in case said data item cannot be coded efficiently by said second coding scheme, the method further comprises the steps of:
   detecting a repetition pattern concerning said data item; and
   coding said data item by a pattern repetition scheme if the repetition pattern is detected.

9. The method according to claim 8, further comprising coding said data item by the first coding scheme, in case the repetition pattern is not detected.

10. The method according to claim 1, further comprising:
    decoding a value of the second parameter used for coding said data item with said-at least one second coding scheme; and,
    decoding said at least one data item according to said at least one second parameter of said second coding scheme.

11. A non-transitory computer readable storage medium storing a computer program for binary coding of a structured document comprising a plurality of data items to code, the computer program comprising instructions executable by a computer for carrying out the steps of:
    determining at least one first parameter of a first coding scheme, said first parameter being a coding length;
    determining at least one second parameter of at least one second coding scheme according to said at least one first parameter of said first coding scheme, said first and said at least one second coding scheme being of the same type, wherein determining the second parameter comprises the following steps:

initializing a counting table with coding length values less than the first parameter;

counting a number of data items that can be respectively coded with each coding length value of the counting table;

evaluating a respective coding cost associated with each particular coding length value of the counting table, based on the number of items that can be coded with the respective coding length value; and determining the second parameter as the coding length value associated with the smallest coding cost, and wherein the computer program further comprises instructions for the steps of:

obtaining at least one item of data of said at least one plurality of data items;

evaluating a coding efficiency of said at least one item of data according to said first and said at least one second coding schemes, wherein the coding efficiency is based on the respective coding cost of coding said at least one item of data;

comparing said coding efficiency of said first and said at least one second coding schemes for coding said at least one item of data; and coding said data item according to the at least one second coding scheme, if said data item can be coded more efficiently by said second coding scheme.

12. The storage medium according to claim 11, the computer program further comprising instructions executable by the computer for carrying out the steps of:

decoding a value of the second parameter used for coding said data item with said at least one second coding scheme; and, decoding said at least one data item according to said at least one second parameter of said second coding scheme.

13. A device for binary coding a structured document comprising at least a plurality of data items to code, the device comprising a computer for performing the steps of:

determining at least one first parameter of a first coding scheme, said first parameter being a coding length;

determining at least one second parameter of at least one second coding scheme according to said at least one first parameter of said first coding scheme, said first and said at least one second coding scheme being of the same type, wherein determining the second parameter comprises:

initializing a counting table with coding length values less than the first parameter;

counting a number of data items that can be respectively coded with each coding length value of the counting table;

evaluating a respective coding cost associated with each particular coding length value of the counting table, based on the number of items that can be coded with the respective coding length value; and determining the second parameter as the coding length value associated with the smallest coding cost, wherein the computer further performs the steps of:

obtaining at least one item of data of said at least one plurality of data items;

evaluating a coding efficiency of said at least one item of data according to said first and said at least one second coding schemes, wherein the coding efficiency is based on the respective coding cost of coding said at least one item of data;

comparing said coding efficiency of said first and said at least one second coding schemes for coding said at least one item of data; and coding said data item according to the at least one second coding scheme, if said data item can be coded more efficiently by said second coding scheme.

14. The device according to claim 13, wherein the computer further performs the steps of:

decoding a value of the second parameter used for coding said data item with said at least one second coding scheme; and, decoding said at least one data item according to said at least one second parameter of said second coding scheme.

* * * * *